United States Patent
Kim et al.

(10) Patent No.: US 10,978,374 B2
(45) Date of Patent: Apr. 13, 2021

(54) SEMICONDUCTOR PACKAGE FOR DISCHARGING HEAT GENERATED BY SEMICONDUCTOR CHIP

(71) Applicant: Samsung Electronics Co., Ltd., Suwon-si (KR)

(72) Inventors: Hyunki Kim, Asan-si (KR); Sangsoo Kim, Cheonan-si (KR); Seung Hwan Kim, Asan-si (KR); Kyung Suk Oh, Seongnam-si (KR); Yongkwan Lee, Hwaseong-si (KR); Jongho Lee, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/285,480

(22) Filed: Feb. 26, 2019

(65) Prior Publication Data

US 2020/0027818 A1    Jan. 23, 2020

(30) Foreign Application Priority Data

Jul. 20, 2018   (KR) ......................... 10-2018-0084510

(51) Int. Cl.
| | |
|---|---|
| *H01L 23/433* | (2006.01) |
| *H01L 25/065* | (2006.01) |
| *H01L 23/367* | (2006.01) |
| *H01L 25/07* | (2006.01) |
| *H01L 23/00* | (2006.01) |

(52) U.S. Cl.
CPC ........ *H01L 23/4334* (2013.01); *H01L 23/367* (2013.01); *H01L 24/32* (2013.01); *H01L 25/0657* (2013.01); *H01L 25/071* (2013.01); *H01L 25/074* (2013.01); *H01L 2224/32145* (2013.01); *H01L 2225/06555* (2013.01); *H01L 2225/06589* (2013.01)

(58) Field of Classification Search
CPC ... H01L 23/36; H01L 23/367; H01L 23/4334; H01L 25/0657; H01L 25/071; H01L 25/074; H01L 2224/32145; H01L 2225/06555; H01L 2225/06589
USPC .................................................. 257/686, 712
See application file for complete search history.

(56) References Cited

U.S. PATENT DOCUMENTS

| | | | |
|---|---|---|---|
| 9,177,942 B2 | 11/2015 | Kim et al. | |
| 9,190,338 B2 | 11/2015 | Park et al. | |
| 9,741,644 B2 | 8/2017 | Katti et al. | |
| 9,865,570 B1 | 1/2018 | England et al. | |
| 2015/0279787 A1* | 10/2015 | Kim ................... | H01L 23/544 257/777 |

(Continued)

FOREIGN PATENT DOCUMENTS

| | | |
|---|---|---|
| KR | 10-2011-0124061 A | 11/2011 |
| KR | 101099577 B1 | 12/2011 |

*Primary Examiner* — Matthew E Warren
(74) *Attorney, Agent, or Firm* — Harness, Dickey & Pierce, P.L.C.

(57) ABSTRACT

Disclosed is a semiconductor package comprising a package substrate, a first semiconductor chip on the package substrate and including a first region and a second region, a second semiconductor chip on the first region, a heat radiation spacer on the second region, a third semiconductor chip supported by the second semiconductor chip and the heat radiation spacer, and a molding layer covering the first to third semiconductor chips and the heat radiation spacer.

7 Claims, 10 Drawing Sheets

(56) References Cited

U.S. PATENT DOCUMENTS

| | | |
|---|---|---|
| 2016/0118366 A1* | 4/2016 | Jang ................. H01L 23/367 |
| | | 257/773 |
| 2016/0329271 A1* | 11/2016 | Katti ................. H01L 23/49541 |
| 2017/0141096 A1 | 5/2017 | Fogal et al. |
| 2017/0148665 A1 | 5/2017 | Hsieh et al. |
| 2017/0162663 A1 | 6/2017 | Tsai et al. |
| 2017/0194445 A1 | 7/2017 | Su et al. |
| 2017/0211802 A1 | 7/2017 | Dellock et al. |
| 2017/0301668 A1 | 10/2017 | Kim et al. |
| 2017/0358524 A1 | 12/2017 | Dry |
| 2018/0026021 A1 | 1/2018 | Morino |
| 2018/0028072 A1 | 2/2018 | Shi |
| 2018/0047704 A1* | 2/2018 | Haba ................. H01L 25/0652 |
| 2019/0148256 A1* | 5/2019 | Jung ................. H01L 23/367 |
| | | 257/712 |

* cited by examiner

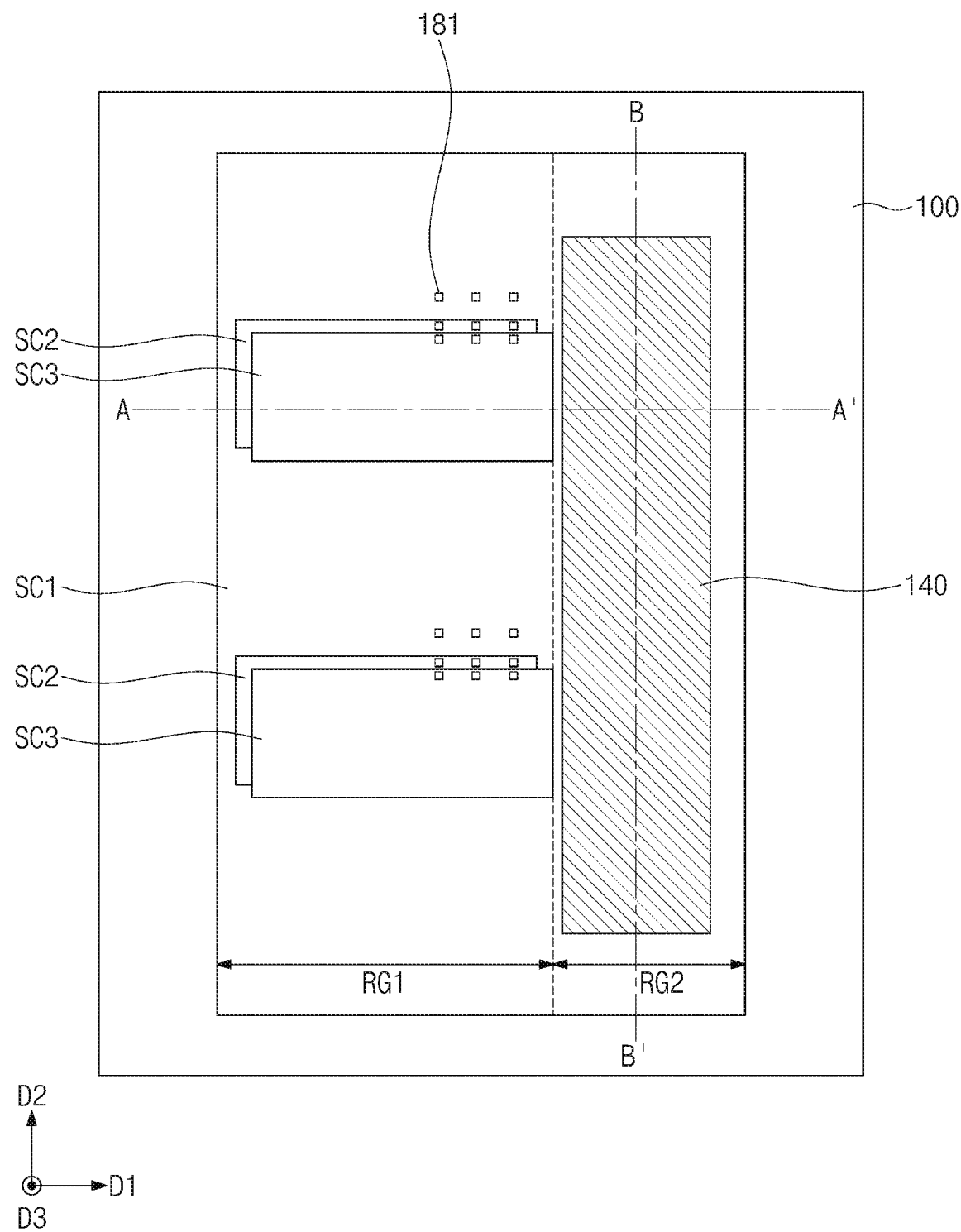

SEMICONDUCTOR PACKAGE FOR DISCHARGING HEAT GENERATED BY SEMICONDUCTOR CHIP

CROSS-REFERENCE TO RELATED APPLICATION

This U.S. nonprovisional application claims priority under 35 U.S.C § 119 to Korean Patent Application No. 10-2018-0084510 filed on Jul. 20, 2018 in the Korean Intellectual Property Office, the entire contents of which are hereby incorporated by reference.

BACKGROUND

The present inventive concepts relate to a semiconductor package, and more particularly, to a semiconductor package including a heat radiation spacer.

With the rapid development of electronics industry and in response to customers' demands, electronic devices have been fabricated to be downscaled and/or light-weight and to have higher capacities. Semiconductor packages have been developed including a number of semiconductor chips. Semiconductor packages have been developed including a plurality of semiconductor chips having various types and sizes.

SUMMARY

Some example embodiments of the present inventive concepts provide a semiconductor package capable of effectively discharging heat generated from a semiconductor chip.

According to some example embodiments of the present inventive concepts, a semiconductor package may comprise: a package substrate; a first semiconductor chip on the package substrate and including a first region and a second region; a second semiconductor chip in the first region; a heat radiation spacer in the second region; a third semiconductor chip supported by the second semiconductor chip and the heat radiation spacer; and a molding layer covering the first to third semiconductor chips and the heat radiation spacer.

According to some example embodiments of the present inventive concepts, a semiconductor package may comprise: a package substrate; a first semiconductor chip on the package substrate and including a first region and a second region; a heat radiation spacer on the first semiconductor chip, the heat radiation spacer comprising a base including a first segment in the first region and a second segment in the second region, and a protrusion on the second segment; a second semiconductor chip on the first segment; a third semiconductor chip supported by the second semiconductor chip and the protrusion; and a molding layer covering the first to third semiconductor chips and the heat radiation spacer.

According to some example embodiments of the present inventive concepts, a semiconductor package may comprise: a package substrate; a first semiconductor chip on the package substrate and including a first region and a second region; a pair of second semiconductor chips spaced apart from each other in the first region; a heat radiation spacer in the second region; a pair of third semiconductor chips on a corresponding one of the pair of second semiconductor chips; and a molding layer covering the first to third semiconductor chips and the heat radiation spacer. Each of the third semiconductor chips may include: a first segment on the second semiconductor chip; and a second segment on the heat radiation spacer.

BRIEF DESCRIPTION OF THE DRAWINGS

FIGS. 2A and 3A illustrate plan views showing a method of fabricating a semiconductor package according to some example embodiments of the present inventive concepts.

DETAILED DESCRIPTION OF EMBODIMENTS

Figure 1A:
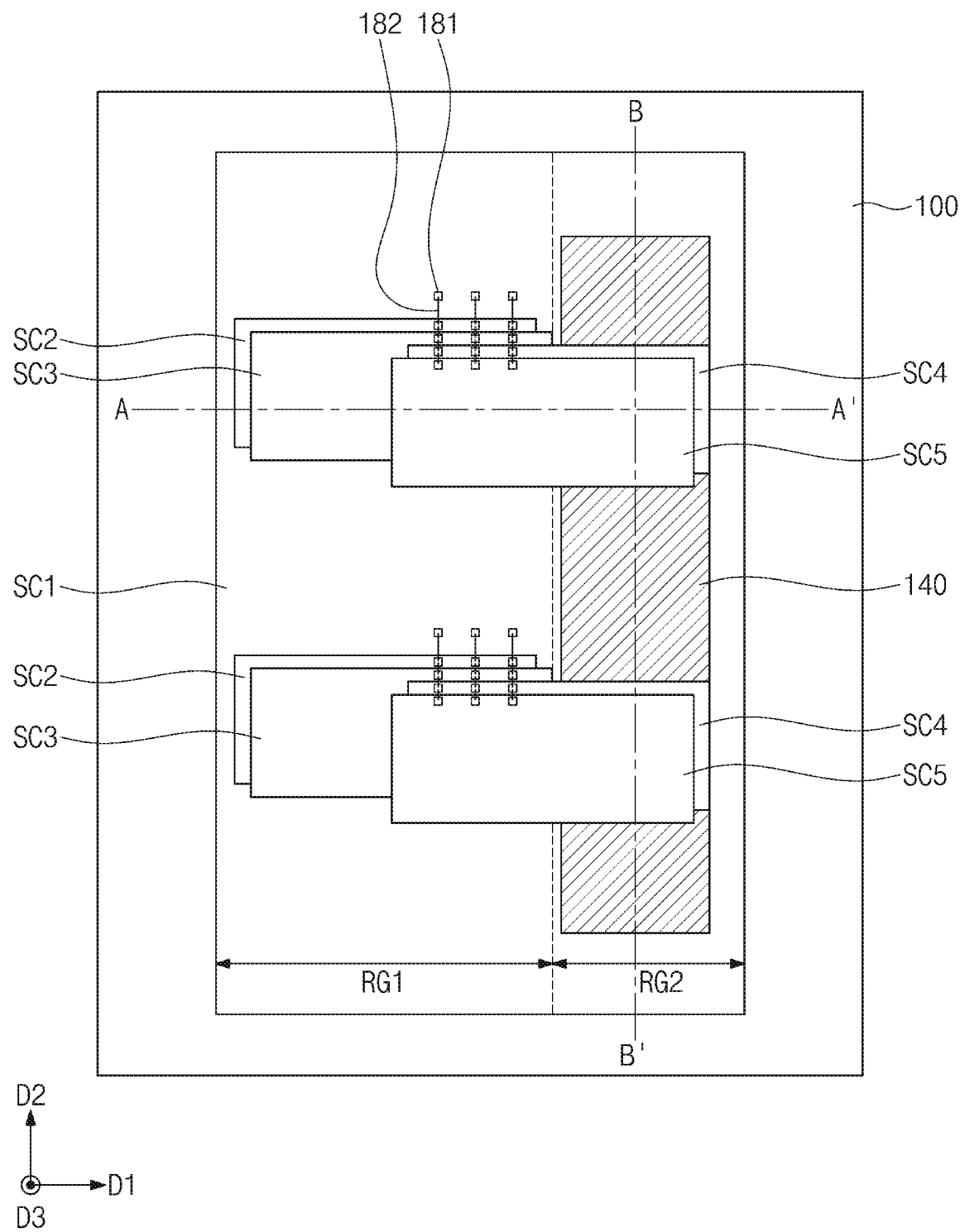
FIG. 1A illustrates a plan view showing a semiconductor package according to some example embodiments of the present inventive concepts.
Figure 1B:
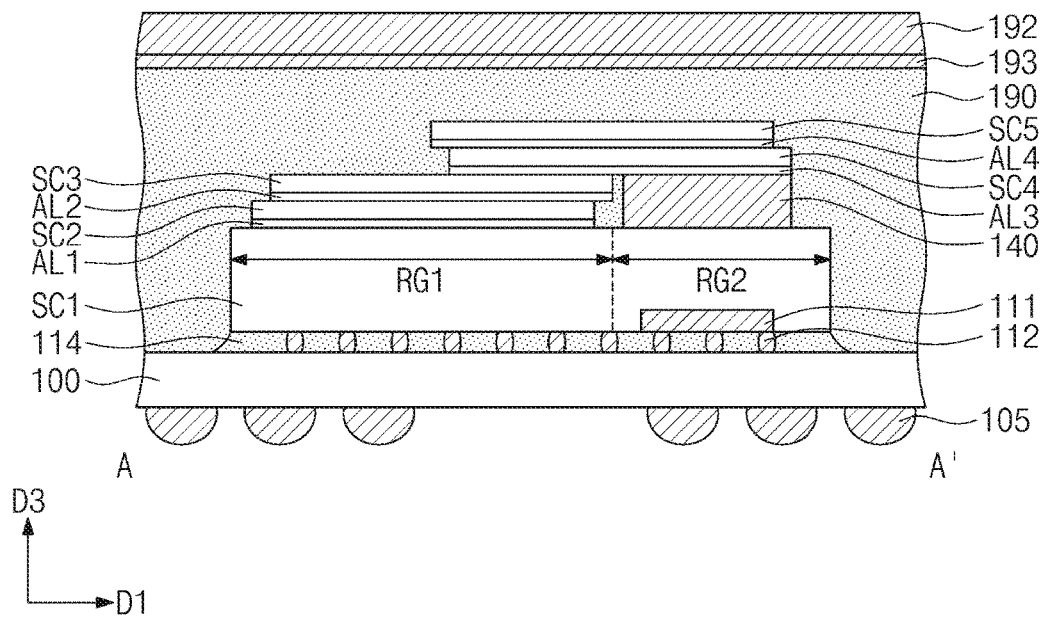
FIG. 1B illustrates a cross-sectional view taken along line A-A' of FIG. 1A.
Figure 1C:
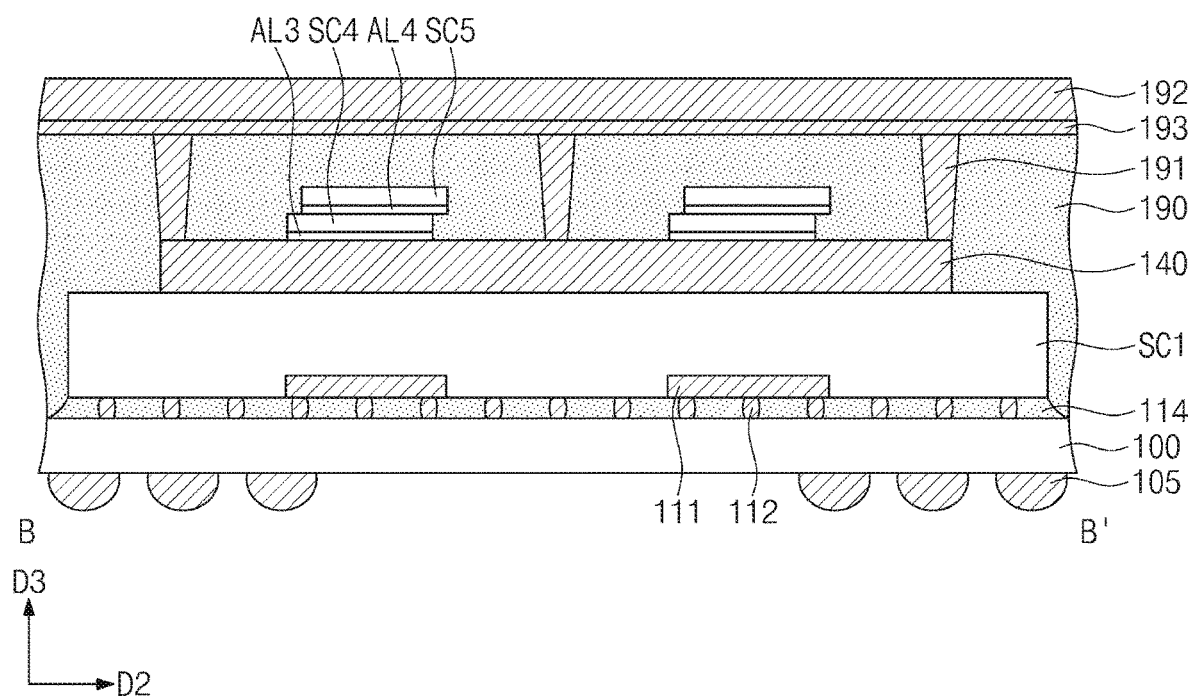
FIG. 1C illustrates a cross-sectional view taken along line B-B' of FIG. 1A.

FIG. 1A illustrates a plan view showing a semiconductor package according to some example embodiments of the present inventive concepts. FIG. 1B illustrates a cross-sectional view taken along line A-A' of FIG. 1A. FIG. 1C illustrates a cross-sectional view taken along line B-B' of FIG. 1A.

Referring to FIGS. 1A to 1C, a package substrate 100 may be provided. The package substrate 100 may be a printed circuit board (PCB) having a circuit pattern.

External terminals 105 may be disposed on a bottom surface of the package substrate 100. The external terminals 105 may be, but not limited to, a solder ball, a conductive bump, a conductive spacer, a pin grid array, or the like. The external terminals 105 may electrically connect the package substrate 100 to an external electric device (not shown).

A first semiconductor chip SC1 may be provided on the package substrate 100. The first semiconductor chip SC1 may include a memory circuit, a logic circuit, or a combination thereof. The first semiconductor chip SC1 may include a first region RG1 and a second region RG2. Heat sources 111 may be embedded in the second region RG2 of the first semiconductor chip SC1. The heat sources 111 may be a central processing unit (CPU), a memory interface, a universal serial bus (USB), or other intellectual property (IP) blocks. The term "IP block" may mean a block where functions required to constitute a semiconductor integrated circuit are configured in a hardware or software manner. The heat sources 111 may be disposed spaced apart from each other in the first semiconductor chip SC1, which may result in minimization or reduction of electrical and/or thermal interference between the heat sources 111. When the first semiconductor chip SC1 is operated, an amount of heat generated from the second region RG2 may be greater than an amount of heat generated from the first region RG1.

The first semiconductor chip SC1 and the package substrate 100 may be electrically connected to each other though connection terminals 112 provided therebetween. The connection terminals 112 may be spaced apart from each other when viewed in plan. The connection terminals 112 may have a solder or bump shape. The connection terminals 112 may include a conductive material. For example, the connection terminals 112 may include one or more of tin (Sn), lead (Pb), nickel (Ni), gold (Au), silver (Ag), copper (Cu), and bismuth (Bi).

An under-fill layer 114 may be provided to fill a gap between the first semiconductor chip SC1 and the package substrate 100. The under-fill layer 114 may be formed by an under-fill process in which under-fill paste is coated and then cured. The under-fill paste may be, for example, an epoxy-based material containing no conductive particles. The under-fill layer 114 may surround surfaces of the connection terminals 112.

In some example embodiments different from that shown, wire bonding may be used to electrically connect the first semiconductor chip SC1 to the package substrate 100.

A pair of second semiconductor chips SC2 may be provided on the first region RG1 of the first semiconductor chip SC1. The second semiconductor chip SC2 may have a first length in a first direction D1 and a second length in a second direction D2. The first length may be greater than the second length. The first and second directions D1 and D2 may intersect each other and may be parallel to a top surface of the package substrate 100. The pair of second semiconductor chips SC2 may be spaced apart from each other in the second direction D2.

A first adhesive layer AL1 may be provided between the second semiconductor chip SC2 and the first semiconductor chip SC1. The second semiconductor chip SC2 may be adhered through the first adhesive layer AL1 to a top surface of the first semiconductor chip SC1. The first adhesive layer AL1 may be, for example, a direct adhesive film (DAF) or a film over wire (FOW). For example, the first adhesive layer AL1 may include a dielectric material. The first adhesive layer AL1 may electrically insulate the first and second semiconductor chips SC1 and SC2 from each other.

A heat radiation spacer 140 may be provided on the second region RG2 of the first semiconductor chip SC1. The heat radiation spacer 140 may extend in the second direction D2. The heat radiation spacer 140 may vertically overlap the heat sources 111 embedded in the second region RG2 of the first semiconductor chip SC1. The heat radiation spacer 140 may guide discharge of heat generated from the first semiconductor chip SC1. In some example embodiments, the heat radiation spacer 140 may receive heat generated from the first semiconductor chip SC1. For example, the heat radiation spacer 140 may be transferred with heat generated from the heat sources 111. The heat radiation spacer 140 may include a material whose thermal conductivity is high. For example, the heat radiation spacer 140 may include copper (Cu) or silver (Ag). The heat radiation spacer 140 may include a material whose adhesion is strong. For example, the heat radiation spacer 140 may include an adhesive polymer. For another example, the heat radiation spacer 140 may include an adhesive polymer in which copper (Cu) or silver (Ag) particles are distributed.

A third semiconductor chip SC3 may be provided on each of the second semiconductor chips SC2. The third semiconductor chip SC3 may be offset-stacked on the second semiconductor chip SC2. For example, the second semiconductor chip SC2 may be stacked thereon with the third semiconductor chip SC3 that partially exposes a top surface of the second semiconductor chip SC2. A pair of the third semiconductor chips SC3 may be spaced apart from each other in the second direction D2. The third semiconductor chip SC3 may have a top surface at substantially the same level as that of a top surface of the heat radiation spacer 140.

A second adhesive layer AL2 may be provided between the third semiconductor chip SC3 and the second semiconductor chip SC2. The second adhesive layer AL2 may include a material substantially the same as that of the first adhesive layer AL1.

A fourth semiconductor chip SC4 may be provided on the heat radiation spacer 140 and each of the third semiconductor chips SC3. For example, a portion of the fourth semiconductor chip SC4 may be provided on the third semiconductor chip SC3 and other portion of the fourth semiconductor chip SC4 may be provided on the heat radiation spacer 140. In this configuration, the fourth semiconductor chip SC4 may be supported by the third semiconductor chip SC3 and the heat radiation spacer 140. The fourth semiconductor chip SC4 may be offset-stacked on the third semiconductor chip SC3. The fourth semiconductor chip SC4 may cross over the heat radiation spacer 140. A pair of the fourth semiconductor chips SC4 may be spaced apart from each other in the second direction D2.

A third adhesive layer AL3 may be provided between the fourth semiconductor chip SC4 and the third semiconductor chip SC3 and between the fourth semiconductor chip SC4 and the heat radiation spacer 140. The third adhesive layer AL3 may include a material substantially the same as that of the first adhesive layer AL1. The fourth semiconductor chip SC4 may be adhered through the third adhesive layer AL3 to the top surfaces of the third semiconductor chip SC3 and the heat radiation spacer 140.

A fifth semiconductor chip SC5 may be provided on each of the fourth semiconductor chips SC4. The fifth semiconductor chip SC5 may be offset-stacked on the fourth semiconductor chip SC4. A pair of the fifth semiconductor chips SC5 may be spaced apart from each other in the second direction D2.

Each of the second to fifth semiconductor chips SC2 to SC5 may include a memory circuit, a logic circuit, or a combination thereof. Each of the second to fifth semiconductor chips SC2 to SC5 may be a different type semiconductor chip from the first semiconductor chip SC1. For example, the first semiconductor chip SC1 may be a logic chip including a logic circuit, and each of the second to fifth semiconductor chips SC2 to SC5 may be a memory chip including a plurality of memory cells. In some example embodiments, the first semiconductor chip SC1 may manage and control operations of the second to fifth semiconductor chips SC2 to SC5, and an amount of heat generated from the first semiconductor chip SC1 may be greater than an amount of heat generated from each or all of the second to fifth semiconductor chips SC2 to SC5.

A fourth adhesive layer AL4 may be provided between the fifth semiconductor chip SC5 and the fourth semiconductor chip SC4. The fourth adhesive layer AL4 may include a material substantially the same as that of the first adhesive layer AL1.

Connection pads 181 may be provided on each of the first to fifth semiconductor chips SC1 to SC5. The connection pads 181 may be terminals that input or output electrical signals to or from each of the first to fifth semiconductor chips SC1 to SC5. The connection pad 181 may include a conductive material. For example, the connection pad 181 may include one or more of gold (Au), silver (Ag), copper (Cu), nickel (Ni), aluminum (Al), tin (Sn), lead (Pb), platinum (Pt), bismuth (Bi), indium (In), and an alloy thereof.

Bonding wires 182 may be provided to connect the connection pads 181 to each other. The bonding wires 182 may electrically connect the first to fifth semiconductor chips SC1 to SC5 to each other. The bonding wire 182 may include a conductive material. For example, the bonding wire 182 may include one or more of gold (Au), silver (Ag), copper (Cu), aluminum (Al), and an alloy thereof.

In some example embodiments different from that shown, flip-chip bonding may be used to electrically connect the first to fifth semiconductor chips SC1 to SC5 to each other. In some example embodiments, instead of the first to fourth adhesive layers AL1 to AL4, connection terminals and under-fill layers may be provided between the first to fifth semiconductor chips SC1 to SC5.

A molding layer 190 may be provided on the package substrate 100. The molding layer 190 may cover lateral and top surfaces of the first to fifth semiconductor chips SC1 to SC5. The molding layer 190 may also cover lateral and top surfaces of the heat radiation spacer 140. For example, the molding layer 190 may include an epoxy molding compound (EMC).

Heat pathway patterns 191 may be provided to penetrate the molding layer 190. The heat pathway patterns 191 may be provided on the heat radiation spacer 140. The heat pathway patterns 191 may be spaced apart from each other when viewed in plan. Each of the heat pathway patterns 191 may be provided on an edge of the heat radiation spacer 140 or between a pair of the third semiconductor chips SC3. The heat pathway patterns 191 may extend in a vertical direction, for example, in a third direction D3. Each of the heat pathway patterns 191 may have a thermal conductivity greater than that of the molding layer 190. The heat pathway patterns 191 may include a conductive material and/or an adhesive polymer. For example, the conductive material may include one or more of aluminum (Al), tin (Sn), copper (Cu), silver (Ag), aluminum oxide ($Al_2O_3$), zinc oxide (ZnO), silicon carbide (SiC), aluminum nitride (AlN), boron nitride (BN), diamond, and a combination thereof. Heat generated from the first semiconductor chip SC1 may be transferred through the heat radiation spacer 140 to the heat pathway pattern 191.

A heat radiation member 192 may be provided on the molding layer 190. The heat radiation member 192 may include a material whose thermal conductivity is high. For example, the heat radiation member 192 may include one of a heat slag, a heat sink, and a graphite sheet. The heat radiation member 192 may receive and outwardly discharge heat generated from the first semiconductor chip SC1.

A heat transfer layer 193 may be interposed between the molding layer 190 and the heat radiation member 192. The heat transfer layer 193 may be connected to the heat pathway patterns 191. The heat transfer layer 193 may extend between the molding layer 190 and the heat radiation member 192. The heat transfer layer 193 may include the same material as that of the heat pathway pattern 191. For example, the heat transfer layer 193 may include a conductive material and/or an adhesive polymer. The heat radiation member 192 may be adhered though the heat transfer layer 193 to the molding layer 190. Heat generated from the first semiconductor chip SC1 may be transferred through the heat transfer layer 193 to the heat radiation member 192. A semiconductor package according to the present inventive concepts may improve in operating reliability of the first semiconductor chip SC1, compared with a case where neither the heat transfer layer 193 nor the heat radiation member 192 is provided.

Figure 2B:
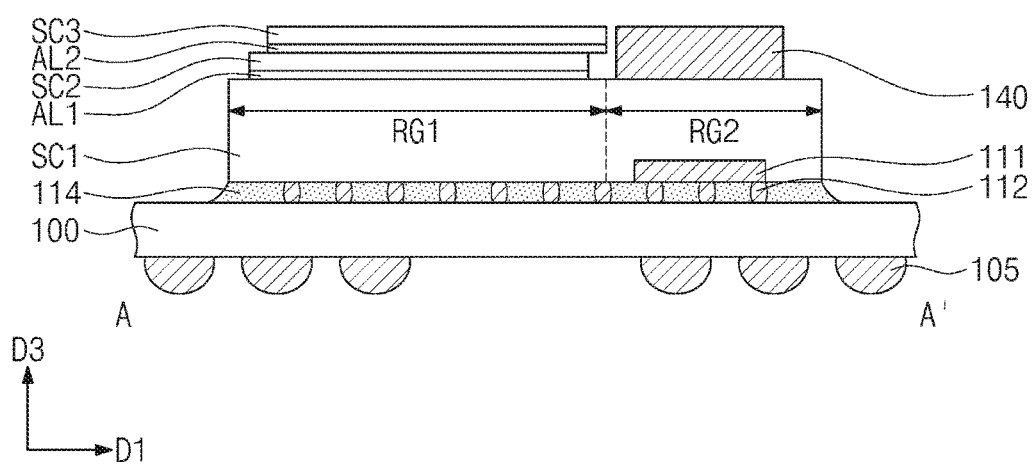
FIGS. 2B and 3B illustrate cross-sectional views taken along line A-A' of FIGS. 2A and 3A, respectively.
Figure 2C:
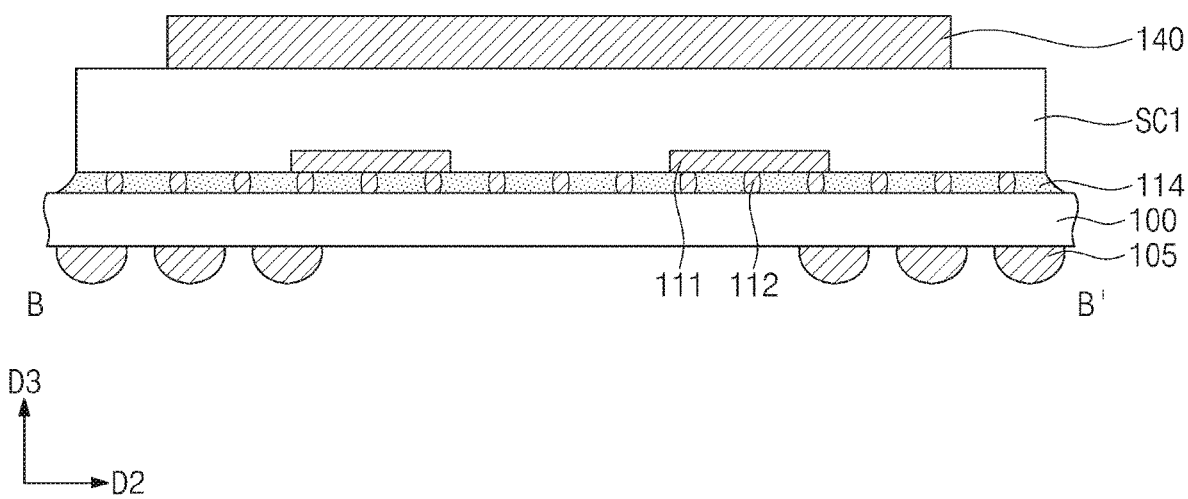
FIGS. 2C and 3C illustrate cross-sectional views taken along line B-B' of FIGS. 2A and 3A, respectively.
Figure 3A:
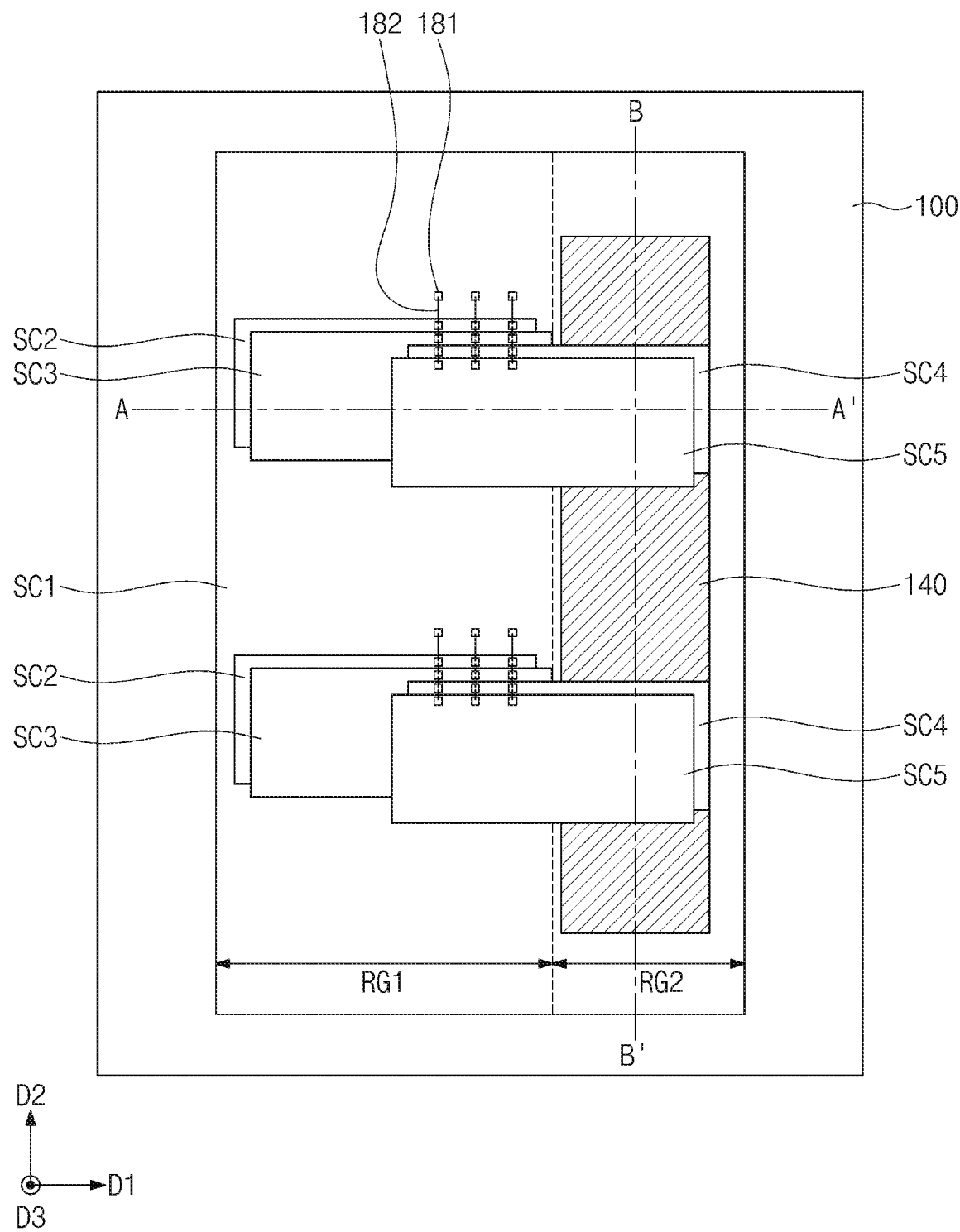
Figure 3B:
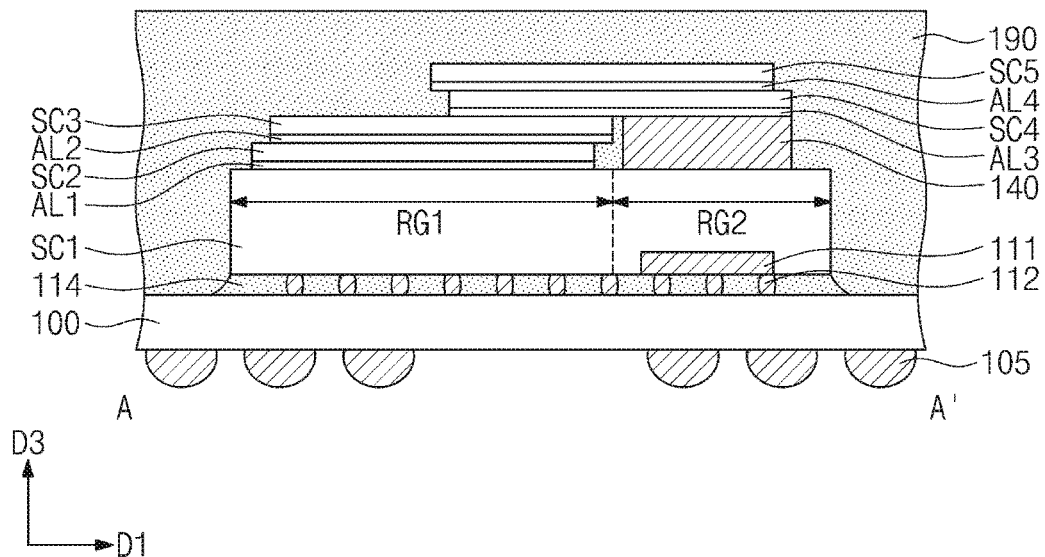
Figure 3C:
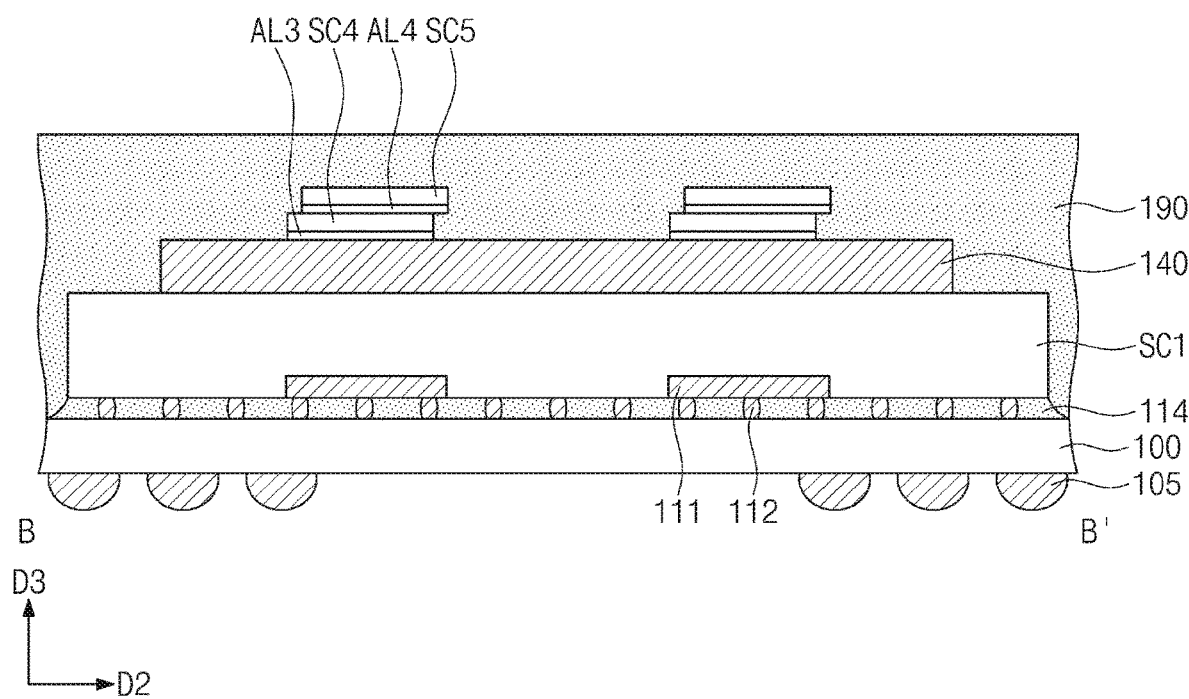

FIGS. 2A and 3A illustrate plan views showing a method of fabricating a semiconductor package according to some example embodiments of the present inventive concepts. FIGS. 2B and 3B illustrate cross-sectional views taken along line A-A' of FIGS. 2A and 3A, respectively. FIGS. 2C and 3C illustrate cross-sectional views taken along line B-B' of FIGS. 2A and 3A, respectively.

For brevity of description, components substantially the same as those discussed with reference to FIGS. 1A to 1C are allocated the same reference numerals thereto, and a repetitive explanation thereof will be omitted.

Referring to FIGS. 2A to 2C, a package substrate 100 may be prepared. External terminals 105 may be formed on a bottom surface of the package substrate 100. A first semiconductor chip SC1 may be provided on the package substrate 100. Connection terminals 112 may be formed to electrically connect the first semiconductor chip SC1 and the package substrate 100 to each other. An under-fill layer 114 may be formed to fill a gap between the first semiconductor chip SC1 and the package substrate 100. The under-fill layer 114 may be formed by an under-fill process in which under-fill paste is coated and then cured. In some example embodiments different from that shown, wire bonding may be used to electrically connect the first semiconductor chip SC1 to the package substrate 100.

Second semiconductor chips SC2 may be provided on a first region RG1 of the first semiconductor chip SC1. Each of the second semiconductor chips SC2 may be adhered through a first adhesive layer AL1 to a top surface of the first semiconductor chip SC1.

A third semiconductor chip SC3 may be provided on each of the second semiconductor chips SC2. The third semiconductor chip SC3 may be offset-stacked on the second semiconductor chip SC2. Each of the third semiconductor chips SC3 may be adhered through a second adhesive layer AL2 to a top surface of the second semiconductor chip SC2.

A heat radiation spacer 140 may be formed on a second region RG2 of the first semiconductor chip SC1. For example, the heat radiation spacer 140 may be formed by coating and curing paste, which includes a material whose thermal conductivity is high, on the second region RG2 of the first semiconductor chip SC1. For another example, the heat radiation spacer 140 may be formed by providing a film, which includes a material whose thermal conductivity is high, on the second region RG2 of the first semiconductor chip SC1. The heat radiation spacer 140 may be formed before or after the second and third semiconductor chips SC2 and SC3 are disposed. Heat sources 111 may be embedded in the second region RG2 of the first semiconductor chip SC1. The heat radiation spacer 140 may vertically overlap the heat sources 111.

Referring to FIGS. 3A to 3C, a fourth semiconductor chip SC4 may be provided on the heat radiation spacer 140 and each of the third semiconductor chips SC3. For example, the fourth semiconductor chip SC4 may be supported by the third semiconductor chip SC3 and the heat radiation spacer 140. The fourth semiconductor chip SC4 may be offset-stacked on the third semiconductor chip SC3. The fourth semiconductor chip SC4 may be adhered through a third adhesive layer AL3 to top surfaces of the third semiconductor chip SC3 and the heat radiation spacer 140.

A fifth semiconductor chip SC5 may be provided on each of the fourth semiconductor chips SC4. The fifth semiconductor chip SC5 may be offset-stacked on the fourth semiconductor chip SC4. Each of the fifth semiconductor chips SC5 may be adhered through a fourth adhesive layer AL4 to a top surface of the fourth semiconductor chip SC4.

Bonding wires 182 may be formed to electrically connect connection pads 181 to each other that are provided on each of the first to fifth semiconductor chips SC1 to SC5. The bonding wires 182 may electrically connect the first to fifth semiconductor chips SC1 to SC5 to each other.

In some example embodiments different from that shown, flip-chip bonding may be used to electrically connect the first to fifth semiconductor chips SC1 to SC5 to each other. In some example embodiments, instead of the first to fourth adhesive layers AL1 to AL4, connection terminals and under-fill layers may be formed between the first to fifth semiconductor chips SC1 to SC5.

A molding layer 190 may be formed on the package substrate 100. The molding layer 190 may cover lateral and top surfaces of the first to fifth semiconductor chips SC1 to SC5. The molding layer 190 may also cover lateral and top surfaces of the heat radiation spacer 140.

Referring back to FIGS. 1A to 1C, heat pathway patterns 191 may be formed to penetrate the molding layer 190. The formation of the heat pathway patterns 191 may include removing a portion of the molding layer 190 to form openings to expose the heat radiation spacer 140, and filling the opening with a conductive material and/or an adhesive polymer. The formation of the openings may include performing laser drilling to remove the portion of the molding layer 190. Because the openings are formed on the heat radiation spacer 140, the first semiconductor chip SC1 may be reduced or prevented from being damaged caused by the laser drilling.

A heat transfer layer 193 may be formed on the molding layer 190. The formation of the heat transfer layer 193 may include coating a conductive material and/or an adhesive polymer on the molding layer 190. The heat transfer layer 193 may be connected to each of the heat pathway patterns 191.

A heat radiation member 192 may be formed on the heat transfer layer 193. The heat transfer layer 193 may attach the heat radiation member 192 to the molding layer 190. When the heat radiation member 192 includes a graphite sheet, the heat transfer layer 193 and the heat radiation member 192 may be simultaneously attached to the molding layer 190.

Figure 4A:
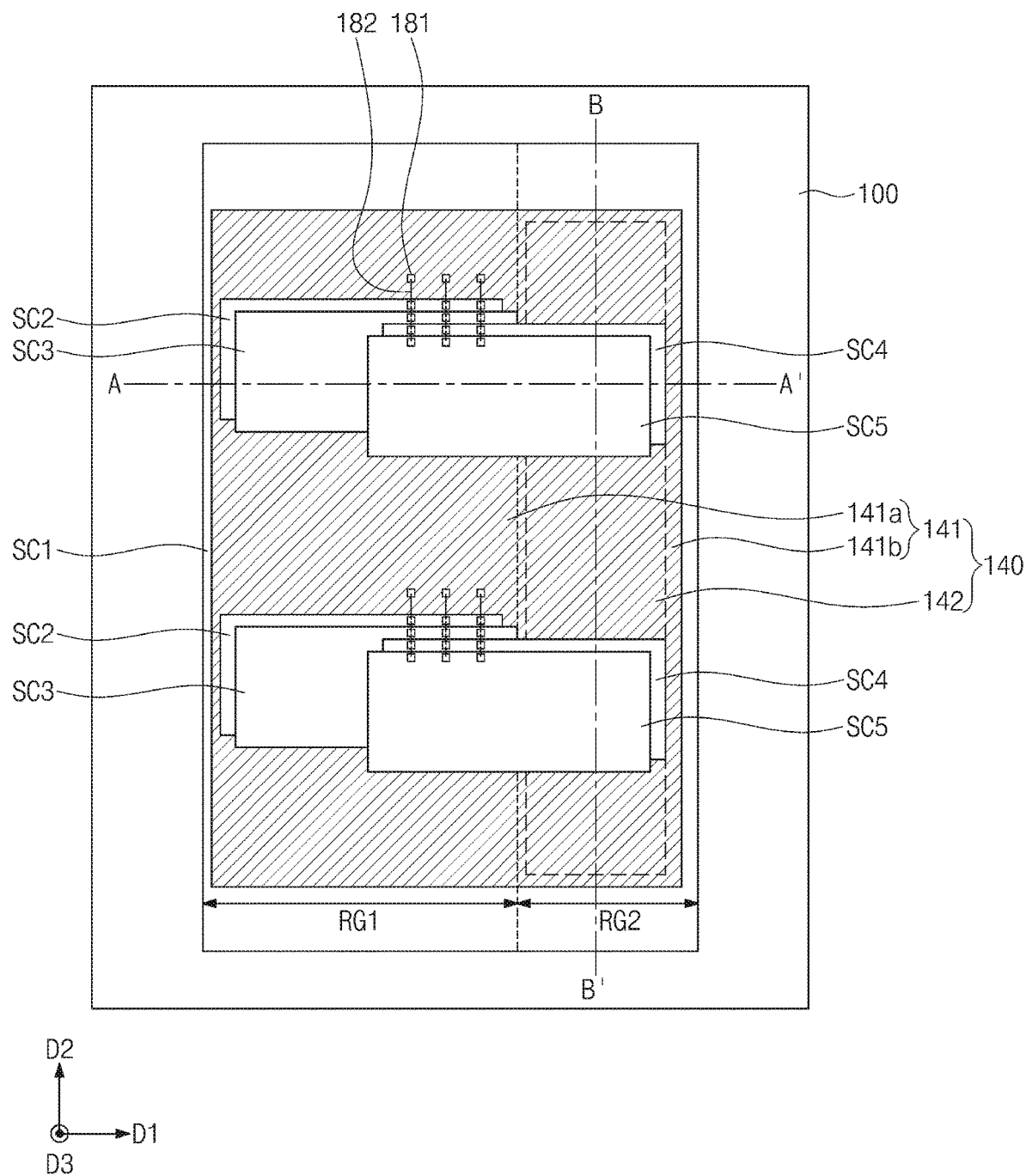
FIG. 4A illustrates a plan view showing a semiconductor package according to some example embodiments of the present inventive concepts.
Figure 4B:
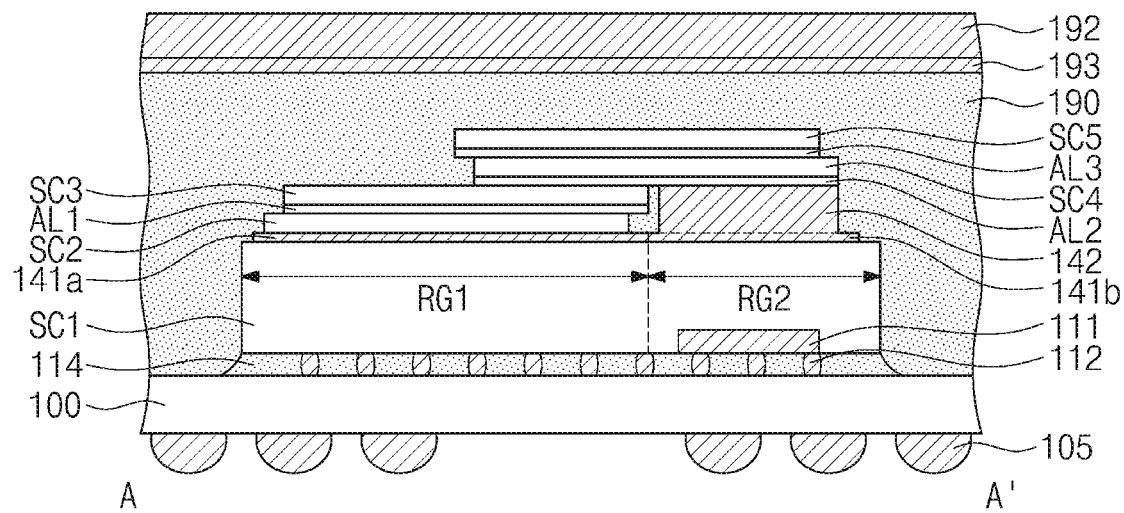
FIG. 4B illustrates a cross-sectional view taken along line A-A' of FIG. 4A.

FIG. 4A illustrates a plan view showing a semiconductor package according to some example embodiments of the present inventive concepts. FIG. 4B illustrates a cross-sectional view taken along line A-A' of FIG. 4A.

For brevity of description, components substantially the same as those discussed with reference to FIGS. 1A to 1C are allocated the same reference numerals thereto, and a repetitive explanation thereof will be omitted.

Referring to FIGS. 4A and 4B, the heat radiation spacer 140 may include a base 141 and a protrusion 142. The base 141 may include a first segment 141a and a second segment 141b. The first segment 141a may be provided on the first region RG1 of the first semiconductor chip SC1. The second segment 141b may be provided on the second region RG2 of the first semiconductor chip SC1. The protrusion 142 may be provided on the second segment 141b. The protrusion 142 may protrude in the third direction D3 on the second segment 141b of the base 141. For example, the protrusion 142 may have a top surface at a higher level than that of a top surface of the base 141. The protrusion 142 may extend in the second direction D2. The protrusion 142 may vertically overlap the heat sources 111 embedded in the second region RG2 of the first semiconductor chip SC1.

The second semiconductor chips SC2 may be provided on the first segment 141a of the base 141 of the heat radiation spacer 140. The second semiconductor chip SC2 may be attached to the first segment 141a through adhesion of the heat radiation spacer 140.

The third semiconductor chip SC3 may be provided on each of the second semiconductor chips SC2. The third semiconductor chip SC3 may have a top surface at substantially the same level as that of a top surface of the protrusion 142 of the heat radiation spacer 140.

The fourth semiconductor chip SC4 may be provided on the protrusion 142 of the heat radiation spacer 140 and each of the third semiconductor chips SC3. For example, a portion of the fourth semiconductor chip SC4 may be provided on the third semiconductor chip SC3 and other portion of the fourth semiconductor chip SC4 may be provided on the protrusion 142 of the heat radiation spacer 140. The fourth semiconductor chip SC4 may be adhered through the second adhesive layer AL2 to the top surfaces of the third semiconductor chip SC3 and the top surface of the protrusion 142 of the heat radiation spacer 140.

Figure 5:
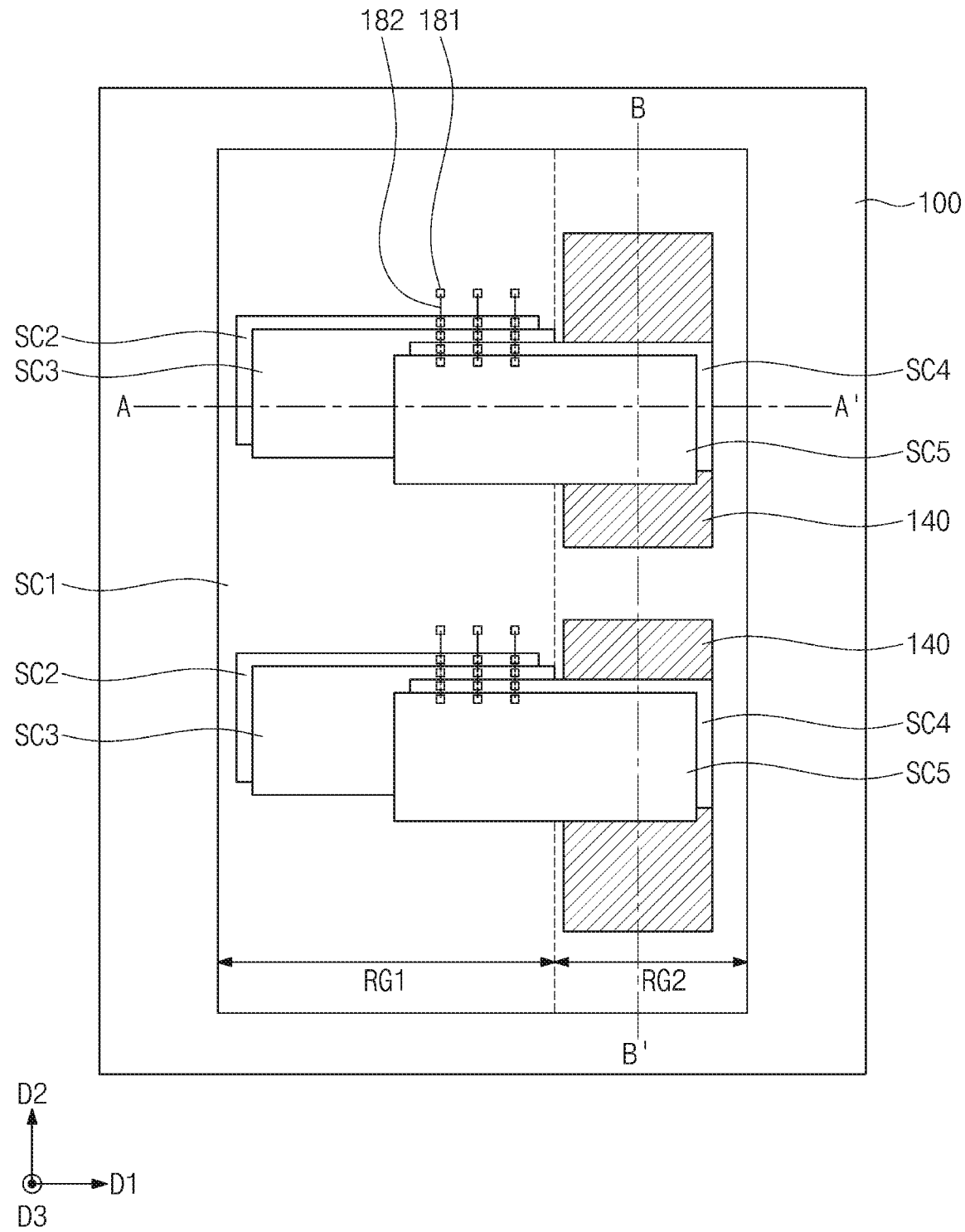
FIG. 5 illustrates a plan view showing a semiconductor package according to some example embodiments of the present inventive concepts.

FIG. 5 illustrates a plan view showing a semiconductor package according to some example embodiments of the present inventive concepts.

For brevity of description, components substantially the same as those discussed with reference to FIGS. 1A to 1C are allocated the same reference numerals thereto, and a repetitive explanation thereof will be omitted.

Referring to FIG. 5, a pair of the heat radiation spacers 140 may be provided on the second region RG2 of the first semiconductor chip SC1. The heat radiation spacers 140 may be spaced apart from each other in the second direction D2. The heat radiation spacers 140 may individually support the fourth semiconductor chips SC4. For example, one heat radiation spacer 140 may support one fourth semiconductor chip SC4. Each of the heat radiation spacers 140 may vertically overlap the heat sources 111 embedded in the second region RG2 of the first semiconductor chip SC1.

Figure 6A:
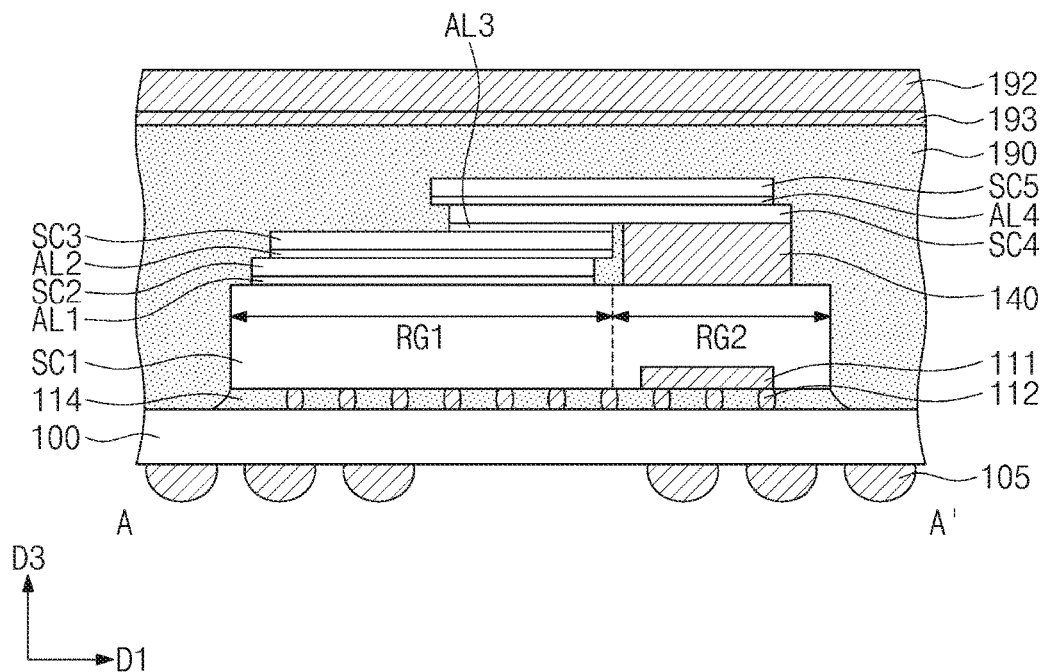
FIG. 6A illustrates a cross-sectional view taken along line A-A' of FIG. 1A.
Figure 6B:
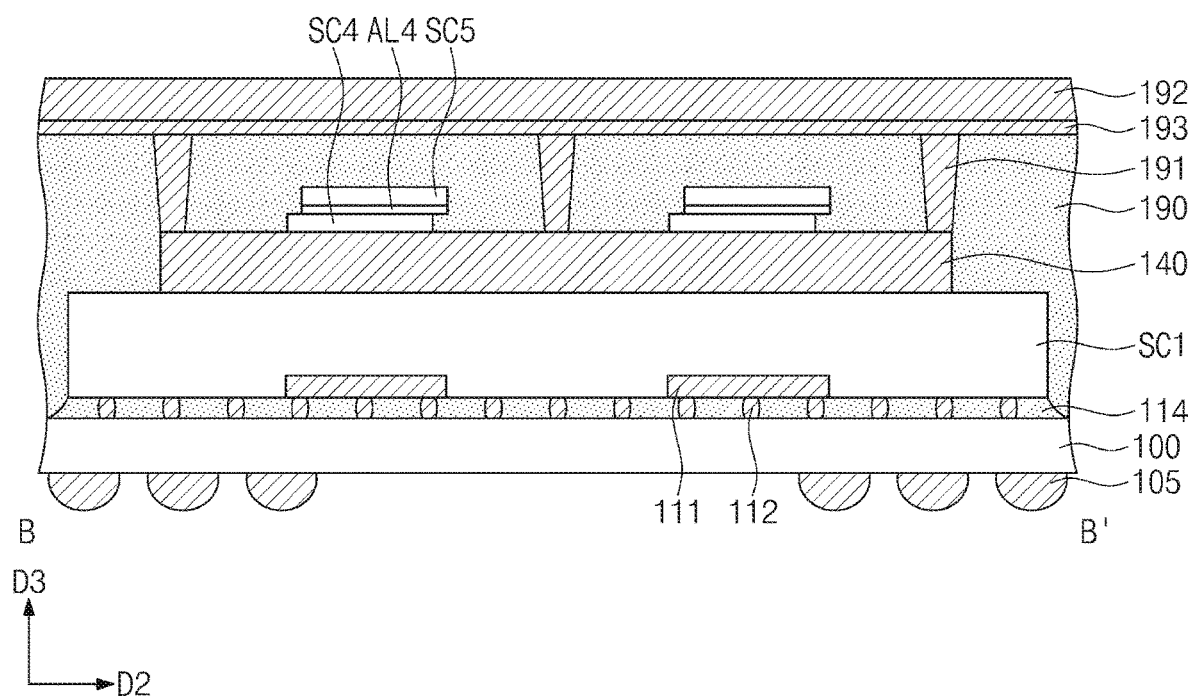
FIG. 6B illustrates a cross-sectional view taken along line B-B' of FIG. 1A.

FIG. 6A illustrates a cross-sectional view taken along line A-A' of FIG. 1A. FIG. 6B illustrates a cross-sectional view taken along line B-B' of FIG. 1A.

For brevity of description, components substantially the same as those discussed with reference to FIGS. 1A to 1C are allocated the same reference numerals thereto, and a repetitive explanation thereof will be omitted.

Referring to FIGS. 1A, 6A, and 6B, the third adhesive layer AL3 may be provided selectively between the fourth semiconductor chip SC4 and the third semiconductor chip SC3, but not between the fourth semiconductor chip SC4 and the heat radiation spacer 140. In some example embodiments, the heat radiation spacer 140 may have a top surface at substantially the same level as that of a top surface of the third adhesive layer AL3, and the fourth semiconductor chip SC4 may directly contact the heat radiation spacer 140. The attachment of the fourth semiconductor chip SC4 may be achieved by adhesion of the heat radiation spacer 140.

According to example embodiments of the present inventive concepts, a semiconductor package may include a heat radiation spacer between semiconductor chips, and thus may effectively discharge heat generated from the semiconductor chips.

Although example embodiments of the present inventive concepts have been described in connection with example embodiments of the present inventive concepts in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor package, comprising:
 a package substrate;
 a first semiconductor chip on the package substrate and including a first region and a second region, the second region being configured to generate more heat than the first region during operation of the first semiconductor chip;
 a second semiconductor chip on the first region;
 a heat radiation spacer on the second region;
 a third semiconductor chip supported by the second semiconductor chip and the heat radiation spacer;
 a fourth semiconductor chip on the third semiconductor chip;
 a molding layer covering the first to fourth semiconductor chips and the heat radiation spacer;
 a heat radiation member on the molding layer; and
 a heat transfer layer interposed between the molding layer and the heat radiation member,
 wherein the fourth semiconductor chip covers a top surface of the heat radiation spacer.

2. The semiconductor package of claim 1, wherein the first semiconductor chip includes a heat source in the second region.

3. The semiconductor package of claim 2, wherein the heat source is vertically overlapped by the heat radiation spacer.

4. The semiconductor package of claim 1, further comprising:
 a heat pathway pattern that penetrates the molding layer and is connected to the heat radiation spacer.

5. The semiconductor package of claim 4,
 wherein the heat transfer layer connects the heat pathway pattern to the heat radiation member.

6. The semiconductor package of claim 1, further comprising an adhesive layer between the third semiconductor chip and the second semiconductor chip and between the third semiconductor chip and the heat radiation spacer.

7. The semiconductor package of claim 1, further comprising an adhesive layer between the third semiconductor chip and the second semiconductor chip,
 wherein the third semiconductor chip directly contacts the heat radiation spacer.

* * * * *